(12) United States Patent
Briggs et al.

(10) Patent No.: US 9,673,058 B1
(45) Date of Patent: Jun. 6, 2017

(54) METHOD FOR ETCHING FEATURES IN DIELECTRIC LAYERS

(71) Applicant: Lam Research Corporation, Fremont, CA (US)

(72) Inventors: Scott Briggs, Menlo Park, CA (US); Eric Hudson, Berkeley, CA (US); Leonid Belau, Pleasanton, CA (US); John Holland, San Jose, CA (US); Mark Wilcoxson, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/069,022

(22) Filed: Mar. 14, 2016

(51) Int. Cl.
*H01L 21/311* (2006.01)

(52) U.S. Cl.
CPC .. *H01L 21/31116* (2013.01); *H01L 21/31144* (2013.01)

(58) Field of Classification Search
CPC .................................................. H01L 21/31116
USPC ............................................................ 438/695
See application file for complete search history.

(56) References Cited

U.S. PATENT DOCUMENTS

| | | | |
|---|---|---|---|
| 2011/0151670 A1* | 6/2011 | Lee | H01L 21/32138 438/695 |
| 2013/0157470 A1 | 6/2013 | Watanabe et al. | |
| 2014/0220785 A1 | 8/2014 | Watanabe et al. | |
| 2015/0050807 A1* | 2/2015 | Wu | H01L 21/28556 438/669 |

OTHER PUBLICATIONS

U.S. Appl. No. 14/803,578 by Hudson et al.; entitled "Technique to Deposit Metal-Containing Sidewall Passivation for High Aspect Ration Cylinder Tech" filed Jul. 20, 2015.

* cited by examiner

*Primary Examiner* — Roberts Culbert
(74) *Attorney, Agent, or Firm* — Beyer Law Group LLP

(57) ABSTRACT

A method for etching features in a silicon oxide containing etch layer disposed below a patterned mask in a chamber is provided. An etch gas comprising a tungsten containing gas is flowed into the chamber. The etch gas comprising the tungsten containing gas is formed into a plasma. The silicon oxide etch layer is exposed to the plasma formed from the etch gas comprising the tungsten containing gas. Features are etched in the silicon oxide etch layer while exposed to the plasma formed from the etch gas comprising the tungsten containing gas.

17 Claims, 5 Drawing Sheets

METHOD FOR ETCHING FEATURES IN DIELECTRIC LAYERS

BACKGROUND

Field of the Invention

The disclosure relates to a method of forming semiconductor devices on a semiconductor wafer. More specifically, the disclosure relates to etching a dielectric layer in the formation of memory.

In forming semiconductor devices, etch layers may be etched to form memory holes or lines.

SUMMARY

To achieve the foregoing and in accordance with the purpose of the present disclosure, a method for etching features in a silicon oxide containing etch layer disposed below a patterned mask in a chamber is provided. An etch gas comprising a tungsten containing gas is flowed into the chamber. The etch gas comprising the tungsten containing gas is formed into a plasma. The silicon oxide etch layer is exposed to the plasma formed from the etch gas comprising the tungsten containing gas. Features are etched in the silicon oxide etch layer while exposed to the plasma formed from the etch gas comprising the tungsten containing gas.

In another manifestation, a method for etching features in a silicon oxide containing etch layer disposed below a patterned mask in a chamber is provided. An etch gas comprising $WF_6$ and a carbon containing passivation component is flowed into the chamber. The etch gas comprising $WF_6$ and a carbon containing passivation component is formed into a plasma. The silicon oxide etch layer is exposed to the plasma formed from the etch gas comprising $WF_6$ and a carbon containing passivation component. Features are etched in the silicon oxide etch layer while exposed to the plasma formed from the etch gas comprising $WF_6$ and a carbon containing passivation component, while forming a sidewall passivation layer of tungsten and carbon containing passivation.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
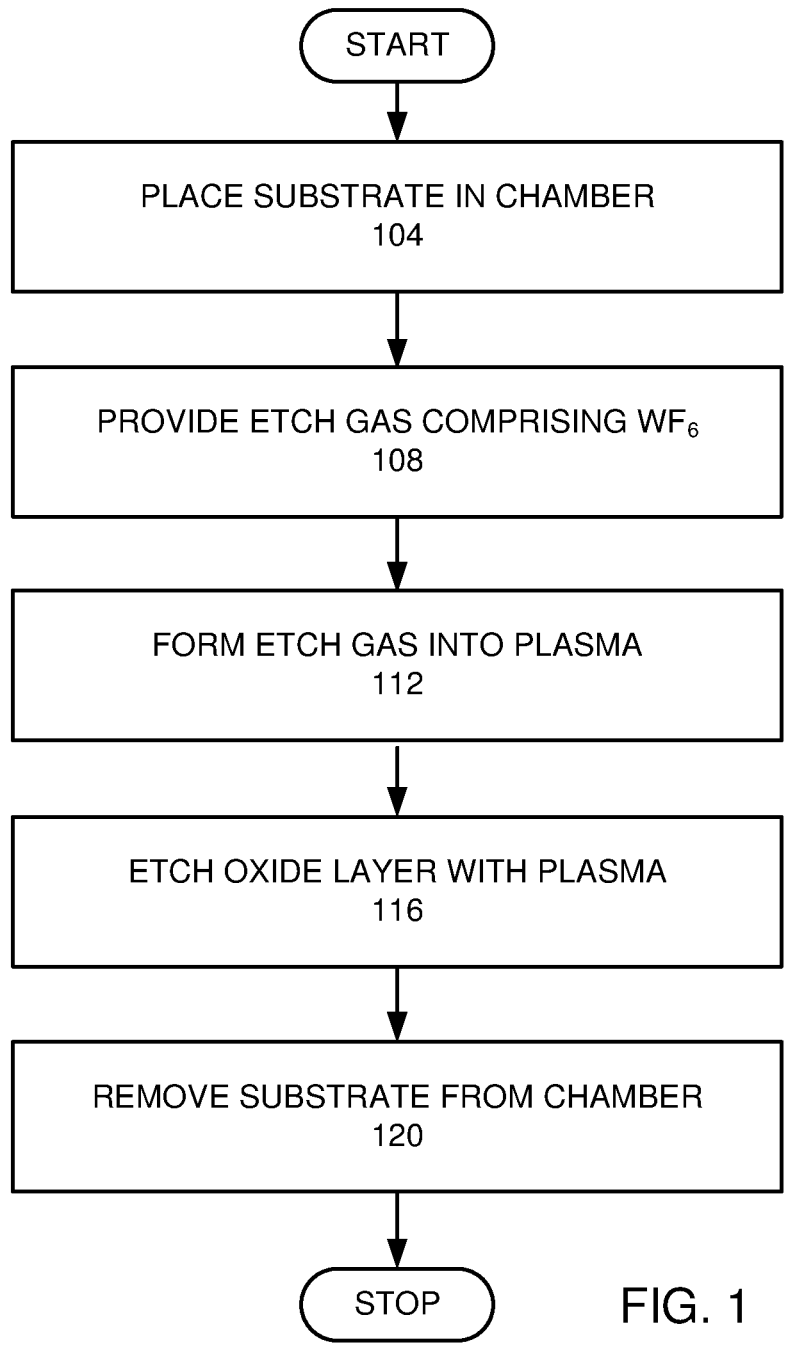
FIG. 1 is a high level flow chart of an embodiment of the invention.

FIG. 1 is a high level flow chart of an embodiment of the invention. In this embodiment, a substrate is placed in an etch chamber (step 104). Preferably, the substrate has a silicon oxide containing etch layer disposed below a patterned mask. An etch gas comprising $WF_6$ is flowed into the etch chamber (step 108). The etch gas is formed into an etch plasma (step 112). The silicon oxide containing etch layer is etched by the etch plasma (step 116). The substrate is removed from the etch chamber (step 120).

EXAMPLE

Figure 2A:
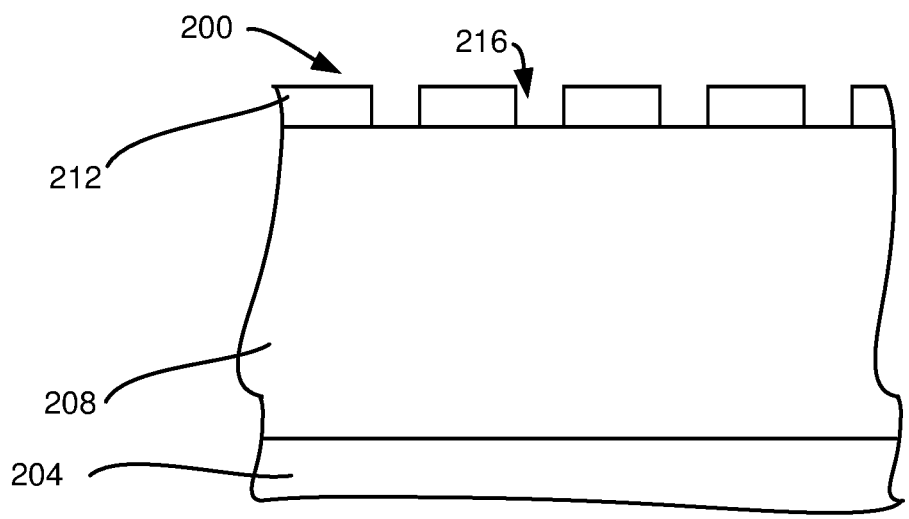
FIGS. 2A-B are schematic cross-sectional views of a stack processed according to an embodiment of the invention.

In a preferred embodiment of the invention, a substrate with a silicon oxide containing etch layer disposed under a patterned mask is placed in an etch chamber (step 104). FIG. 2A is a schematic cross-sectional view of a stack 200 with a substrate 204 with a silicon oxide etch layer 208 disposed below a patterned mask 212. In this example, one or more layers may be disposed between the substrate 204 and the silicon oxide containing etch layer 208, or the silicon containing etch layer 208 and the patterned mask 212. In this example, the patterned mask 212 is amorphous carbon (polysilicon for DRAM, carbon for VNAND) and the silicon oxide containing etch layer 208 is a bulk silicon oxide based dielectric, which may be used for forming DRAM. In this example, patterned mask pattern provides mask features 216 for high aspect ratio contacts. In some embodiments, the mask features are formed before the substrate is placed in the chamber. In other embodiments, the mask features 216 are formed while the substrate is in the etch chamber.

Figure 3:
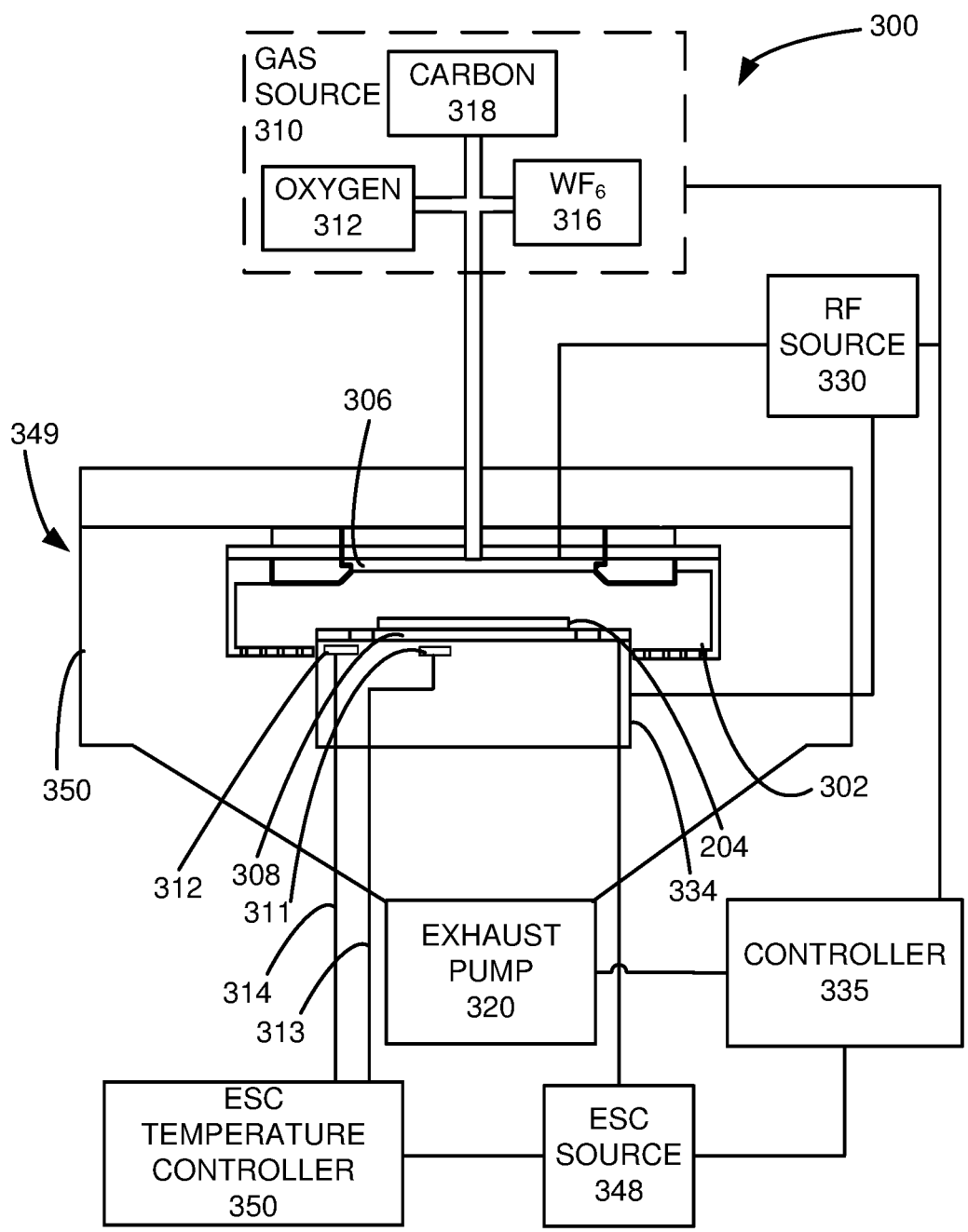
FIG. 3 is a schematic view of a etch chamber that may be used in an embodiment of the invention.

FIG. 3 is a schematic view of an etch reactor that may be used in an embodiment. In one or more embodiments of the invention, an etch reactor 300 comprises a gas distribution plate 306 providing a gas inlet and an electrostatic chuck (ESC) 308, within an etch chamber 349, enclosed by a chamber wall 350. Within the etch chamber 349, a substrate 204 is positioned on top of the ESC 308. The ESC 308 may provide a bias from the ESC source 348. A gas source 310 is connected to the etch chamber 349 through the distribution plate 306. In this embodiment, the etch gas source 310 comprises an oxygen containing gas source 312, a $WF_6$ gas source 316, and a carbon containing gas source 318. Each gas source may comprise multiple gas sources. For example the carbon containing gas source 318 may comprise a fluorocarbon gas source and a fluorohydrocarbon gas source. The etch gas source 310 may further comprise other gas sources. An ESC temperature controller 350 is connected to the ESC 308, and provides temperature control of the ESC 308. In this example, a first connection 313 for providing power to an inner heater 311 for heating an inner zone of the ESC 308 and a second connection 314 for providing to an outer heater 312 for heating an outer zone of the ESC 308. An RF source 330 provides RF power to a lower electrode 334 and an upper electrode, which in this embodiment is the gas distribution plate 306. In a preferred embodiment, 2 MHz, 60 MHz, and optionally 27 MHz power sources make up the RF source 330 and the ESC source 348. In this embodiment, one generator is provided for each frequency.

In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. A controller 335 is controllably connected to the RF source 330, the ESC source 348, an exhaust pump 320, and the etch gas source 310. An example of such a etch chamber is the Exelan Flex™ etch system manufactured by Lam Research Corporation of Fremont, Calif. The process chamber can be a CCP (capacitive coupled plasma) reactor or an ICP (inductive coupled plasma) reactor.

Figure 4:
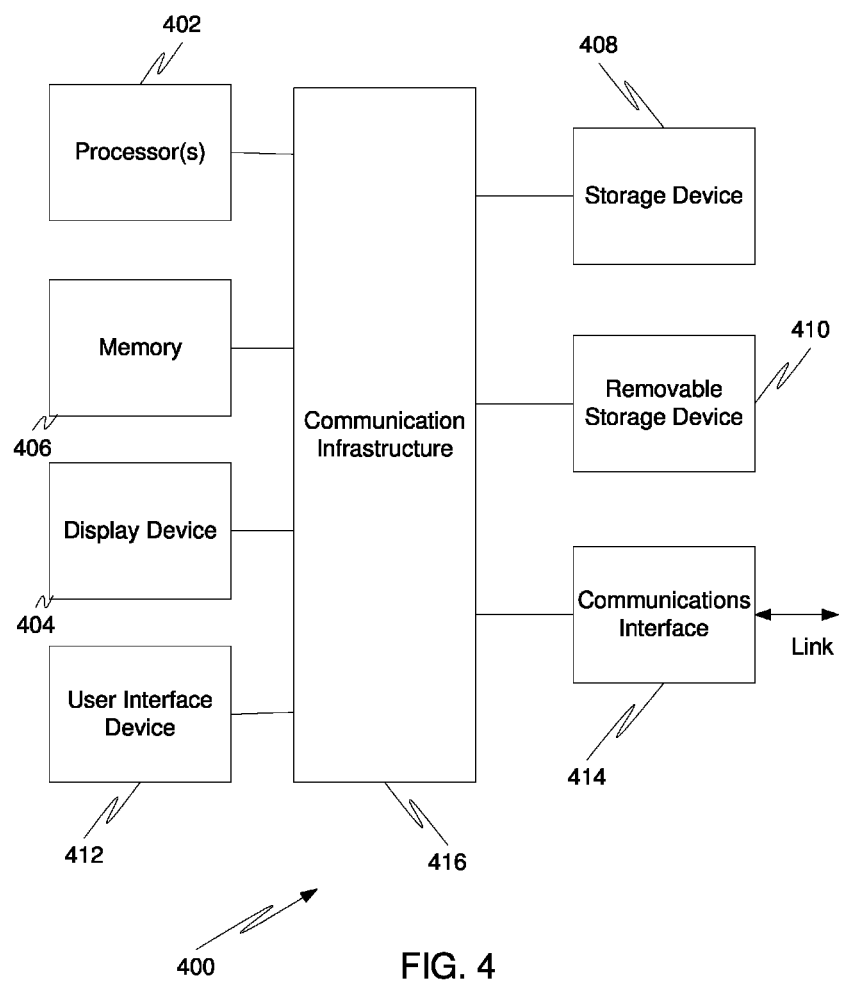
FIG. 4 is a schematic view of a computer system that may be used in practicing the invention.

FIG. 4 is a high level block diagram showing a computer system 400, which is suitable for implementing a controller 335 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

After the substrate 204 has been placed into the etch chamber 300, an etch gas comprising $WF_6$ is flowed into the etch chamber (step 108). In this example, where the silicon oxide containing etch layer 208 is a bulk silicon oxide based dielectric and the patterned mask 212 is polysilicon amorphous carbon, the etch gas comprises 0.1 to 5 sccm $WF_6$, 30 to 100 sccm $C_4F_6$ and/or $C_4F_8$, 0 to 25 sccm $NF_3$, and 30 to 150 sccm $O_2$. In this example, a pressure of 10 to 60 mTorr provided. The etch gas is formed into a plasma (step 112). This may be accomplished by providing an excitation RF with a frequency of 60 MHz at 200 to 4000 watts. For high aspect ratio etches, a high bias is desirable. In this embodiment, the high bias is provided by providing an RF with a frequency of 2 MH at 2000 to 12,000 watts. A substrate temperature of 10 to 80° C. is maintained. Exposure of the silicon oxide containing etch layer 208 to the plasma from the etch gas comprising $WF_6$ causes the plasma from the etch gas comprising $WF_6$ to etch contacts into the silicon oxide containing etch layer (step 116). The plasma is maintained for 180 to 1800 seconds.

After the silicon oxide etch layer is etch, the process is stopped, which in this example, is by stopping the flow of the etch gas comprising $WF_6$. Other processing steps may be performed in the etch chamber. The substrate is then removed from the etch chamber (step 120).

Figure 2B:
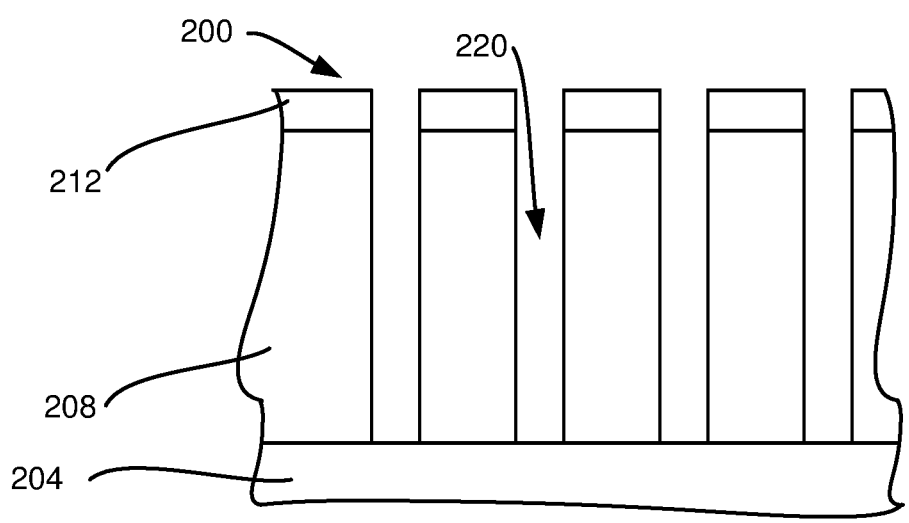

FIG. 2B is a cross-sectional view of the stack 200 after the contacts 220 have been etched. The contacts are high aspect ratio contacts. Preferably, the high aspect ratio contacts have a height to CD width ratio of between 20:1 to 100:1. More preferably, the contacts have an aspect ratio of between 40:1 to 100:1.

Without being limited by theory, it is believed that $WF_6$ has a lower sticking coefficient and is more etch resistant than carbon based passivation. Having a lower sticking coefficient than carbon based passivation allows the $WF_6$ to provide passivation closer to bottoms of high aspect ratio features. In addition, being more etch resistant than carbon based passivation provides improved sidewall passivation.

In some embodiments the etch gas further comprises a carbon containing passivation component. In some embodiments, the carbon containing passivation component comprises at least one of a fluorohydrocarbon, a fluorocarbon, or a hydrocarbon. Preferably, the etch gas further comprises an oxygen containing component, such as $O_2$, or COS. Preferably, the etch gas has a carbon containing component, wherein a ratio of molar amount of carbon in the etch gas to molar amount of $WF_6$ of the etch gas is between 10,000:1 to 5:1. More preferably, the ratio is between 1,000:1 to 15:1. Most preferably, the ratio is between 500:1 to 20:1.

In some embodiment the bias during the etching is at least 200 volts. More preferably, the bias during the etching is at least 800 volts. Most preferably, the bias during etching is at least 1600 volts.

Figure 5:
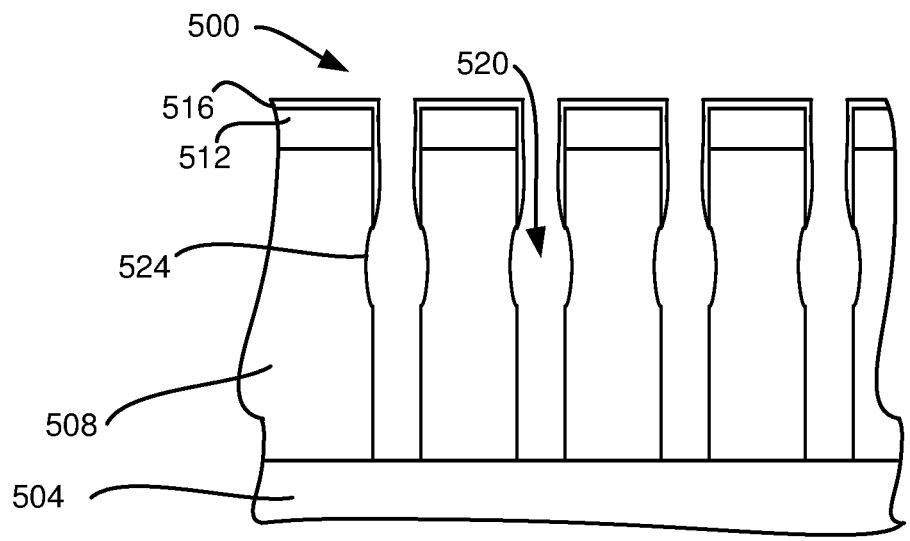
FIG. 5 is a schematic cross-sectional view of a stack processed according to the prior art.

FIG. 5 is a schematic cross-sectional view of a stack 500 that has been etched with a prior art etch method that does not use $WF_6$ in the etch gas, where the view of the passivation is illustrated as larger than scale in order to more clearly show the passivation. The stack 500 comprises a substrate 504, disposed below an etch layer 508, disposed below a patterned mask 512. In such an etch, the carbon passivation 516 has a higher sticking coefficient, so that more passivation 516 is deposited near the top of the features 520. In addition, since carbon passivation 516 is less etch resistant, the thinner passivation closer to the bottom of the features 520 is etched away. In order to form high aspect ratio contacts, a high bias is applied to accelerate ions to bottoms of the features. Such a high bias increases the removal of the carbon passivation 516. As a result, the features 520 have a bowing 524 in the sidewalls of the feature 520 below the remaining carbon passivation 516. Such bowing increases device failure.

Figure 6:
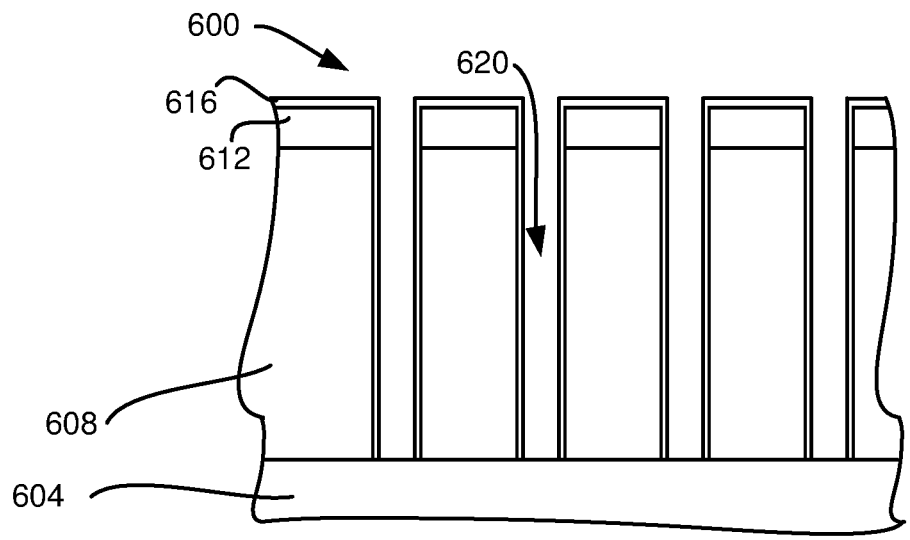
FIG. 6 is a schematic cross-sectional view of a stack processed according to an embodiment.

FIG. 6 is a schematic cross-sectional view of a stack 600 that has been etched with an etch method that uses $WF_6$ in the etch gas along with a carbon passivation component, where the view of the passivation is illustrated as larger than scale in order to more clearly show the passivation. The stack 600 comprises a substrate 604, disposed below an etch layer 608, disposed below a patterned mask 612. Such an etch has a passivation 616 which is a combination of a carbon passivation and a $WF_6$ passivation. The carbon passivation has a higher sticking coefficient, so that more passivation is deposited near the top of the features 620. In addition, the carbon passivation 616 is less etch resistant. The $WF_6$ passivation has a lower sticking coefficient and is more etch resistant than the carbon passivation. As a result, more $WF_6$ is deposited nearer to the bottom of the features 620, and the $WF_6$ passivation is etched away more slowly, allowing a thinner passivation to provide the same protection. In order to form high aspect ratio contacts, a high bias is applied to accelerate ions to bottoms of the features. As a result, the passivation 616 provided by the $WF_6$ or a combination of carbon passivation and $WF_6$ passivation, provides more passivation along the entire length of the sidewalls of the features 620. As a result, the bowing is reduced, which results in a decreased device failure. It has been found that such a combination is able to minimize bowing CD, while maximizing bottom CD.

By providing a single step etch where the $WF_6$ gas is part of the etch gas, a faster etch is provided, compared to multiple step processes where $WF_6$ is used as a component of a deposition gas during a deposition phase, instead of part of an etch gas during an etch phase. Some multiple step etch processes with a deposition step and etch step may require separate chambers for deposition and etching, where transportation time between the chambers further increases processing time. It was unexpectedly found that $WF_6$ used during an etch in combination with a carbon passivation during the etch would provide passivation that minimizes bowing during the etch step.

In another embodiment, the silicon oxide containing etch layer comprises a plurality of alternating silicon oxide and silicon nitride layers, which are known in the art as ONON layers, which may be used for memory devices, such as V-NAND memory. Such layers form a dielectric etch layer. In this example, the mask is amorphous carbon. In this example, the etch gas would comprise $CH_2F_2$, $WF_6$, and at least one of $C_4F_6$ or $C_4F_8$.

In another embodiment, the silicon oxide containing etch layer comprises a plurality of alternating silicon oxide and polysilicon layers, which are known in the art as OPOP layers, which may be used for 3D memory devices. In this example, the mask is amorphous carbon. In this example, the etch gas would comprise HBr, C4F8, $CH_3F$, $WF_6$, $CH_4$, $H_2$, COS, and $NF_3$.

In addition, since at least some embodiments replace a carbon passivation layer with a mixture of a carbon and tungsten passivation layer, the passivation layer is more conductive. A more conductive passivation layer reduces voltage potential build up, which reduces problems caused by arcing within the substrate 604 and/or the stack 600.

In some embodiments, other etch steps may be performed in addition to the etch step with an etch gas comprising $WF_6$. For example, the etch gas comprising $WF_6$ is introduce for a portion of the overall sequence of recipe steps needed to fully etch the silicon oxide containing etch layer 208. In some such examples, $WF_6$ may be introduced into one or more steps of a multistep etch sequence. In other examples, a cyclic recipe may be employed in which the $WF_6$-containing recipe step alternates with a non-$WF_6$ recipe step, with at least 2 such cycles employed in the overall process sequence.

In other embodiments, other tungsten containing gases may be used instead of $WF_6$. More preferably, other tungsten and halogen containing gases may be used. For example $WF_5Cl$, $WBr_6$, $W(CO)_6$, or $WCl_6$ may be used in place of $WF_6$.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for etching features in a silicon oxide containing etch layer disposed below a patterned mask in a chamber, comprising:
   flowing an etch gas comprising a tungsten containing gas into the chamber;
   forming the etch gas comprising the tungsten containing gas into a plasma;
   exposing the silicon oxide etch layer to the plasma; and
   etching features in the silicon oxide etch layer while exposed to the plasma from the etch gas comprising the tungsten containing gas.

2. The method, wherein the tungsten containing gas is $WF_6$.

3. The method, as recited in claim 2, wherein the etch gas further comprises a carbon containing passivation component.

4. The method, as recited in claim 3, wherein the etch gas further comprises a halogen containing component in addition to $WF_6$, wherein the halogen containing component may be the carbon containing passivation component or another halogen containing compound.

5. The method, as recited in claim 4, wherein the etch gas further comprises an oxygen containing component.

6. The method, as recited in claim 5, further comprising providing a bias of at least 200 volts.

7. The method, as recited in claim 5, wherein a ratio of a molar amount of carbon provided by the carbon containing passivation component of the etch gas to a molar amount of $WF_6$ is in the range of 10,000:1 and 10:1.

8. The method, as recited in claim 7, wherein the carbon containing passivation component comprises at least one of a hydrocarbon, a fluorohydrocarbon, or a fluorocarbon.

9. The method, as recited in claim 8, further comprising:
   stopping the flow of the etch gas comprising $WF_6$ into the etch chamber;
   flowing an etch gas that is free of $WF_6$ into the etch chamber;
   forming the etch gas that is free of $WF_6$ into a plasma formed from the etch gas that is free of $WF_6$;
   exposing the silicon oxide etch layer to the plasma formed from the etch gas that is free of $WF_6$; and
   further etching features in the silicon oxide etch layer while exposed to the plasma formed from the etch gas that is free of $WF_6$.

10. The method, as recited in claim 9, wherein the etching the features comprises a plurality of cycles of alternating steps of etching with a plasma formed from the etch gas comprising $WF_6$ and etching with a plasma formed from the etch gas free of $WF_6$.

11. The method, as recited in claim 3, wherein the silicon oxide containing etch layer comprises at least one of a bulk silicon oxide layer, a ONON layer, or a OPOP layer.

12. The method, as recited in claim 11, wherein the patterned mask is of at least one of amorphous carbon or polysilicon.

13. The method, as recited in claim 3, wherein a ratio of a molar amount of carbon provided by the carbon containing passivation component of the etch gas to a molar amount of $WF_6$ is in the range of 10,000:1 and 10:1.

14. The method, as recited in claim 3, wherein the carbon containing passivation component comprises at least one of a hydrocarbon, a fluorohydrocarbon, or a fluorocarbon.

15. The method, as recited in claim 1, further comprising providing a bias of at least 200 volts.

16. A method for etching features in a silicon oxide containing etch layer disposed below a patterned mask in a chamber, comprising:

flowing an etch gas comprising $WF_6$ and a carbon containing passivation component into the chamber;

forming the etch gas comprising $WF_6$ and a carbon containing passivation component into a plasma;

exposing the silicon oxide etch layer to the plasma formed from the etch gas comprising $WF_6$ and a carbon containing passivation component; and etching features in the silicon oxide etch layer while exposed to the plasma formed from the etch gas comprising $WF_6$ and a carbon containing passivation component, while forming a sidewall passivation layer of tungsten and carbon containing passivation.

17. The method, as recited in claim 16, wherein the etch gas further comprises a halogen containing component in addition to $WF_6$, wherein the halogen containing component may be the carbon containing passivation component or another halogen containing compound.

* * * * *